(12) United States Patent
Stahl

(10) Patent No.: US 6,760,248 B2
(45) Date of Patent: Jul. 6, 2004

(54) VOLTAGE REGULATOR WITH DISTRIBUTED OUTPUT TRANSISTOR

(75) Inventor: Ernst Stahl, Essex Junction, VT (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/267,262

(22) Filed: Oct. 9, 2002

(65) Prior Publication Data

US 2004/0076034 A1 Apr. 22, 2004

(51) Int. Cl.$^7$ .............................................. G11C 11/24
(52) U.S. Cl. ..................... 365/149; 365/63; 365/206
(58) Field of Search ..................... 365/149, 63, 72, 365/206, 207

(56) References Cited

U.S. PATENT DOCUMENTS 5,650,972 A * 7/1997 Tomishima et al. ......... 365/207
6,243,308 B1 * 6/2001 Lin .............................. 365/201

OTHER PUBLICATIONS

Wuensche, et al. "A 110nm 512 Mb DDR with Vertical Transistor Trench Cell," 2002 Symposium on VLSI Circuits, Digest of Technical Papers, Jun. 13–15, 2002, pp. 114–115.

* cited by examiner

Primary Examiner—Tan T. Nguyen
(74) Attorney, Agent, or Firm—Slater & Matsil, L.L.P.

(57) ABSTRACT

A memory device and method of manufacturing thereof having a voltage regulator with distributed output transistor. A novel approach for the bitline high voltage ($V_{BLH}$) generation is used to save chip area by allowing narrower power bussing. The output transistor is distributed along the array edge. In addition, the transistor is divided into sections with different channel widths to compensate for current drive losses due to voltage drops along the $V_{DD}$ power bus. The IR-drop on the $V_{BLH}$ line is eliminated, and a constant output voltage is provided along the array edge.

35 Claims, 4 Drawing Sheets

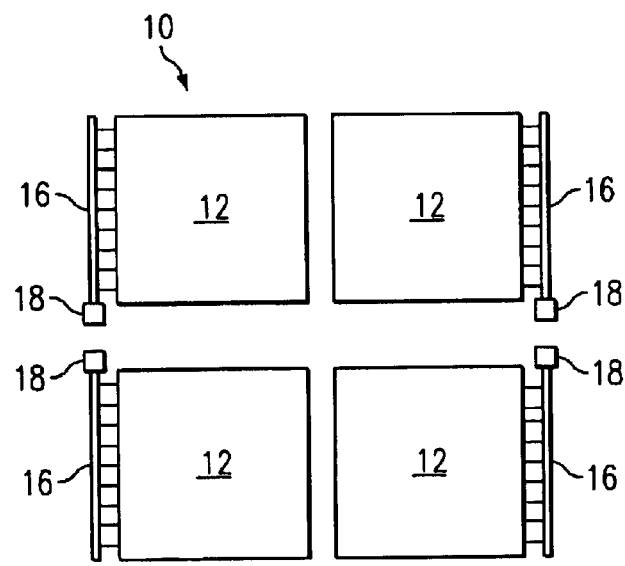
FIG. 1
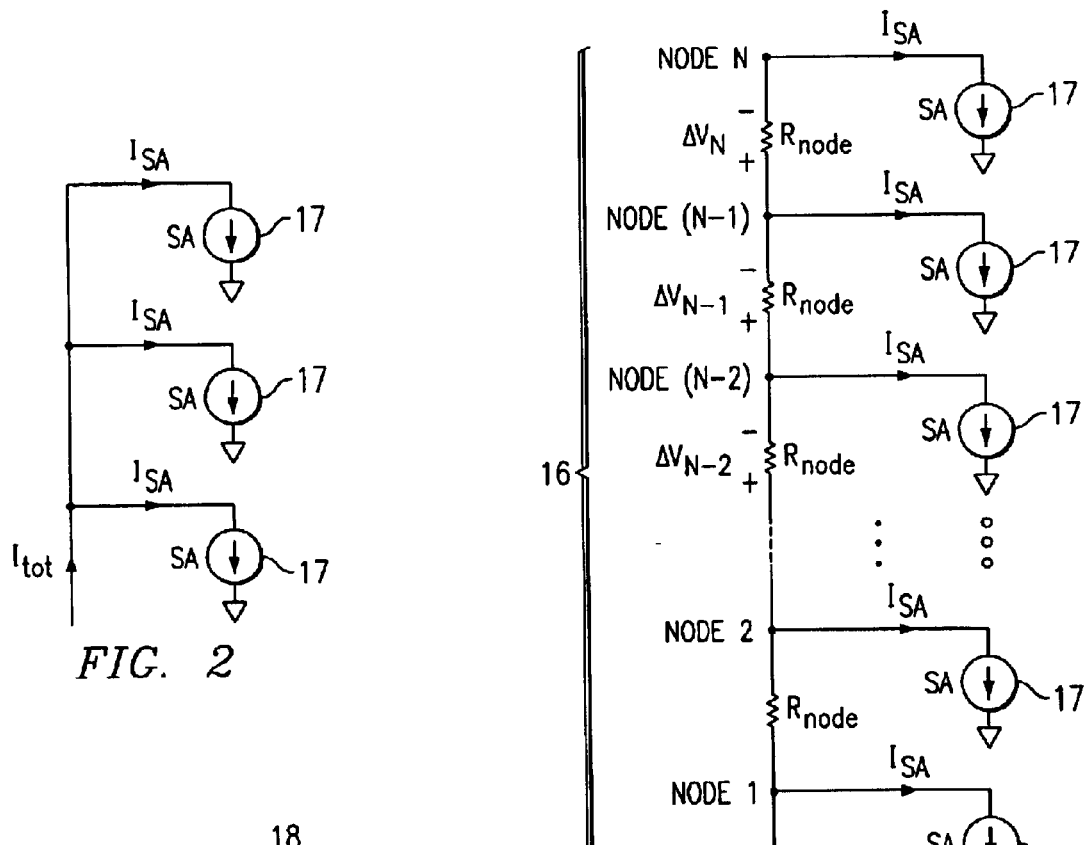
FIG. 2
FIG. 3 (PRIOR ART)
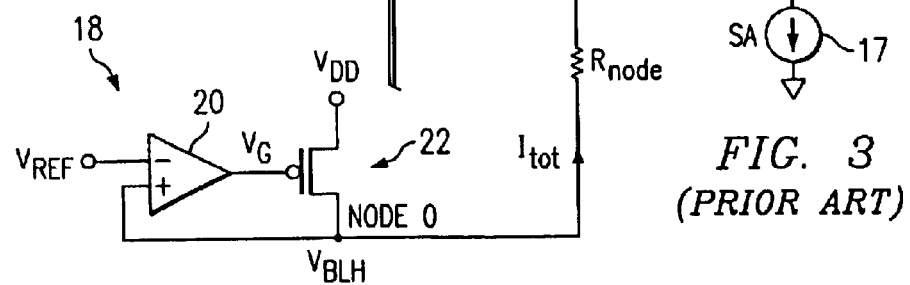

VOLTAGE REGULATOR WITH DISTRIBUTED OUTPUT TRANSISTOR

TECHNICAL FIELD

The present invention relates generally to semiconductor devices, and more particularly to a voltage regulator with a distributed output transistor.

BACKGROUND

Semiconductor devices are used for integrated circuits in a variety of electrical and electronic applications, such as computers, cellular telephones, radios, and televisions, as examples. One particular type of semiconductor device is a semiconductor storage device, such as a random access memory (RAM) device. RAM devices use an electrical charge to store information. RAM devices include many storage cells arranged in a two-dimensional array with two sets of select lines, referred to as wordlines and bitlines. An individual storage cell is selected by activating its wordline and its bitline. RAM devices are considered "random access" because any memory cell in an array can be accessed directly if the row and column that intersect at that cell are known.

A commonly used form of RAM is known as a dynamic RAM (DRAM) device. Dynamic random access memory has memory cells with a paired transistor and capacitor, wherein the capacitor requires continual refreshing. One particular type of DRAM device is a synchronous DRAM (SDRAM) device, in which the device operates synchronously with a clock. To achieve a high-speed operation, a double data rate (DDR) architecture is often used, during which two data transfers are made per clock cycle, one upon the rising edge of the clock and the other on the falling edge.

DRAMs use several on-chip generated voltages for optimized performance. One of these voltages is referred to as the array high voltage $V_{BLH}$, which supplies power to the bitlines. This voltage is the voltage that is used to write to the cell by a primary sense amplifier. Because each cell along a wordline has to be written again after the read out of the cell signal onto the bitline, a homogenous current flows along the array edge into the sense amplifiers.

Some prior art designs use a feedback regulator with a single output transistor, typically located at the array end, to generate the voltage level $V_{BLH}$. In this configuration, a large power bus for $V_{BLH}$ along the array edge is used to supply the sense amplifiers with the write current. Ideally, the conductive material used for the $V_{BLH}$ bus has negligible resistance, and thus the voltage along the $V_{BLH}$ bus is constant along the entire length of the $V_{BLH}$ bus.

In reality, the $V_{BLH}$ bus is long enough that, due to the resistivity of the line, a voltage drop exists on the end of the line away from the power source. In other words, the far end of the $V_{BLH}$ bus has a lower $V_{BLH}$ than the near end of the bus. This lower voltage can result in data being lost during a refresh or write cycle. While the bus could be made physically bigger, e.g., to lower the total resistance, the increase in real estate taken by the bus would be undesirable.

SUMMARY OF THE INVENTION

Embodiments of the present invention achieve technical advantages by distributing the output transistor along the array edge. Rather than using one large output transistor, several smaller transistors are used to compensate for current drive losses due to the voltage drops along the power bus. The transistors have varying channel widths to ensure a consistent voltage level $V_{BLH}$. The power bus along the edge of the array comprises the external power supply voltage $V_{DD}$ rather than the voltage $V_{BLH}$.

In one aspect, the present invention provides a power delivery system for an integrated circuit. This system includes, for example, three power busses (e.g., a $V_{DD}$ bus and two $V_{BLH}$ busses). A first drive transistor is coupled between the first power bus (e.g., $V_{DD}$) and the second power bus (e.g., one of the $V_{BLH}$ busses) and a second drive transistor is coupled between the first power bus (e.g., $V_{DD}$) and the third power bus (e.g., the other of the $V_{BLH}$ busses). The second drive transistor has a current path width that is a different width than the current path width of the first transistor. A differential amplifier has a first input coupled to at least one of the second power bus or the third power bus and a second input coupled to a reference voltage node. The output of the differential amplifier is coupled to the control nodes (e.g., gates) of the drive transistors.

In another aspect, the present invention provides a semiconductor memory array, e.g., a DRAM. The device includes an array of memory cells, a plurality of sense amplifiers, a plurality of bitlines, and a plurality of wordlines. Each bitline is coupled to one of the sense amplifiers. A power bus extends adjacent an edge of the array of memory cells. A plurality of drive transistors is disposed at varying locations adjacent the power bus. Each drive transistor is coupled between the power bus and at least one of the sense amplifiers.

Advantages of various aspects of the invention include providing a feedback voltage regulator with a distributed output transistor that allows the power bus along the edge of the array to be smaller, e.g., less wide, thus saving chip area. The $V_{DD}$ bus may have a relatively large voltage drop without negatively affecting the performance of the memory device. The voltage drop on the $V_{BLH}$ line is eliminated, providing a constant output voltage along the array edge. The output transistor comprises a plurality of distributed output transistors having different channel widths to compensate for current drive losses due to voltage drops along the $V_{DD}$ power bus.

BRIEF DESCRIPTION OF THE DRAWINGS

The above features of the present invention will be more clearly understood from consideration of the following descriptions in connection with accompanying drawings in which:

FIG. 1 shows a memory array with a power bus located at the edge thereof;

FIG. 2 shows a schematic representation of the current flowing into the sense amplifiers during a write back operation;

FIG. 3 shows a prior art voltage regulator having a single large output transistor for a plurality of sense amplifiers coupled to the $V_{BHL}$ bus;

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Figure 4A:
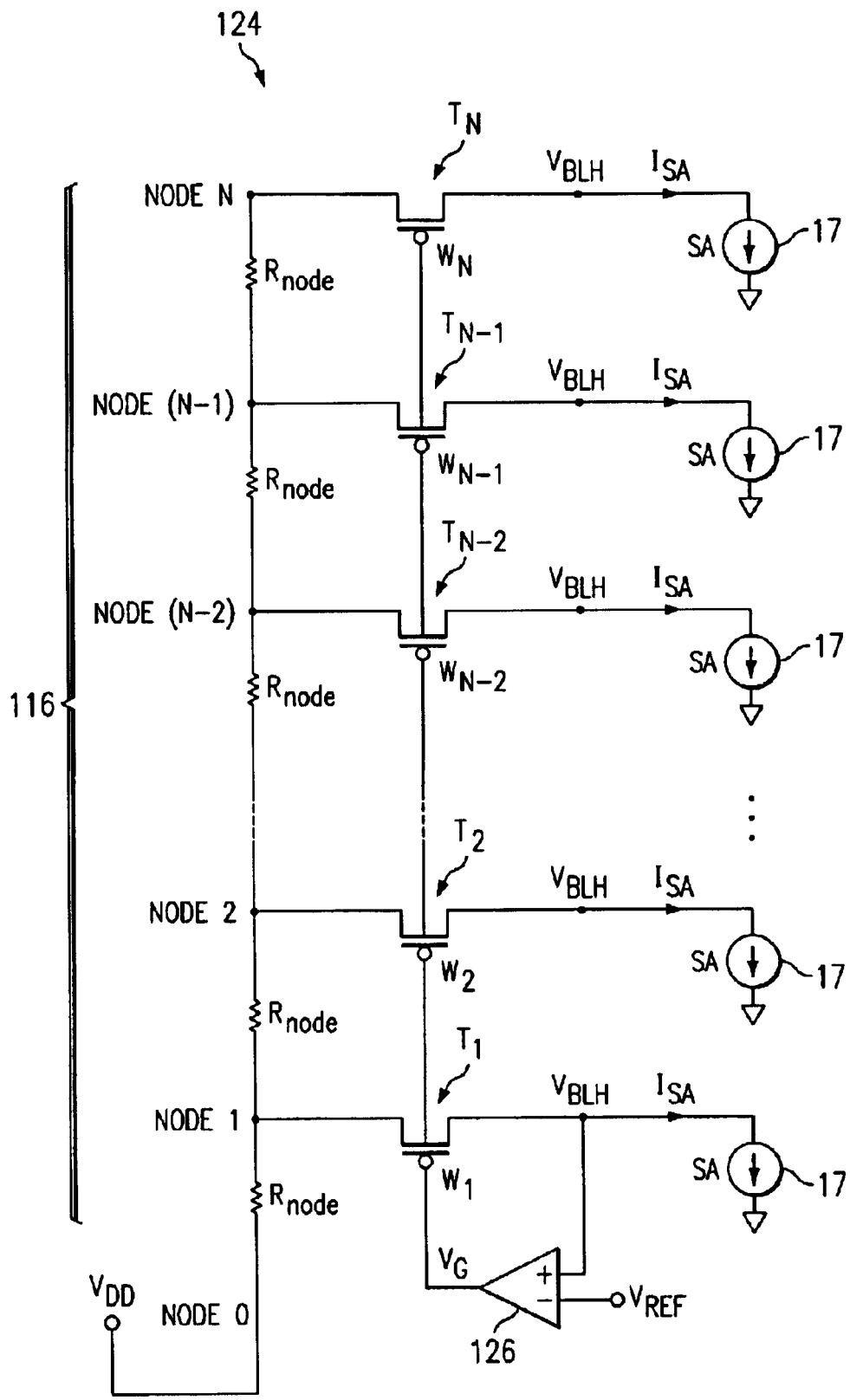
FIG. 4a is a schematic diagram of the voltage regulator with a distributed output transistor in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

A prior art voltage regulator for the bitline high voltage potential $V_{BLH}$ of memory arrays will be discussed, followed by a description of embodiments of the present invention and some advantages thereof.

The present invention will be described herein with respect to one specific example, namely a DRAM. It should be understood, however, that concepts of the invention could be utilized in a large number of contexts. This includes other integrated circuits, e.g., other memories, logic devices, or analog (or mixed signal) devices, or other devices, e.g., discrete components or circuit boards. As one specific example, the present invention could be used with a non-volatile memory such as an electrically erasable programmable read only memory, e.g., flash memory. For example, the present invention can be used with any integrated circuit that has an internally regulated voltage, especially one that draws a substantially constant current during a specific operation.

One on-chip generated voltage of a DRAM is the voltage $V_{BLH}$, which is the voltage written to the cell by the primary sense amplifier. FIG. 1 shows a DRAM device 10 having four memory 128 Mb quadrants, each of which corresponds to an individual logical bank. A chip photograph of this particular example of memory can be found in the paper Wuensche et al., "A 110 nm 512 Mb DDR DRAM with Vertical Transistor Trench Cell," 2002 Symposium on VLSI Circuits, Digest of Technical Papers, June 2002, p. 114–15. The memory device described in the paper utilizes aspects of the present invention and therefore the paper is incorporated herein by reference.

Referring to FIG. 1, each quadrant includes a memory array 12, with a power bus 16 located at the edge of each memory array 12. A feedback regulator 18 is coupled to the bus 16 to generate a second voltage from a first voltage. For example, the voltage regulator 18 receives an external voltage, e.g., at 2.5 V or 3.3 V, and generates an internal voltage, e.g., at 1.5 V. One goal of preferred aspects of the present invention is to maintain a substantially constant internal voltage along the power bus 16. The amount that the voltage can vary is determined by design specification driven by the sensitivity of the sense amplifiers, the leakage of the storage capacitors and other factors. In a typical design, the voltage along bus 16 preferably would not vary by more than about 2% from maximum to minimum.

FIG. 2 shows a schematic representation of the current provided by the power bus 16 to the array of sense amplifiers during write back operation. The current source 17 (in the following referred to as sense amplifier) represents a number of individual sense amplifiers. Further, the current $I_{SA}$ represents the sum of a number of individual sense amplifier currents. The total array current $I_{tot}$ along the edge of the array is equal to the sum of the current to each of the array sense amplifiers $I_{SA}$. Because every cell along a wordline has to be written again after readout of the cell signal onto the bitline, a homogenous current flows along the array edge into the sense amplifiers 17.

FIG. 3 shows a prior art voltage feedback regulator design. In the prior art design shown, a feedback regulator 18 with a single output transistor 22 located at the array end is used to generate the $V_{BLH}$ potential. A differential amplifier 20 is coupled to the single output transistor 22, with a reference voltage $V_{REF}$ and the internal voltage $V_{BLH}$ as inputs. A power bus 16 for $V_{BLH}$ runs along the edge of array 12 and supplies each sense amplifier 17 with the write current $I_{SA}$. The parasitic distributed resistance along the bus 16 is also illustrated in the figure. This distributed resistance causes an undesirable IR-drop along the power bus. In other words, a node N at the far end of the bus 16 has a lower $V_{BLH}$ voltage than node 1 at the near end of the bus 16.

The voltage drop at various nodes of the prior art circuit shown in FIG. 3 will next be calculated. The calculations that follow assume that the resistance $R_{node}$ is substantially equal between the adjacent nodes of the $V_{BLH}$ bus line 16 and that each sense amplifier 17 draws substantially the same amount of current $I_{SA}$. While complicating the mathematics slightly, the analysis provided here would be equally effective if these assumptions were not true.

The voltage $\Delta V_N$ between node (N) and node (N−1) may be represented by Eq. 1:

$$\Delta V_N = R_{node} \cdot I_{SA};  \quad\text{Eq. 1:}$$

where $I_{SA}$ is the current through each sense amplifier, and $R_{node}$ is the resistance of the $V_{BLH}$ bus line 16 between node N and node (N−1).

Accordingly, the voltage drop $\Delta V_{(N-1)}$ across the resistor $R_{node}$ between node (N−1) and node (N−2), which carries twice the current ($I_{SA}$ out of node N and $I_{SA}$ out of node N−1), may be represented by Eq. 2:

$$\Delta V_{(N-1)} = 2 \cdot R_{node} \cdot I_{SA};  \quad\text{Eq. 2:}$$

and the voltage drop between node (N−2) and node (N−3) may be represented by Eq. 3:

$$\Delta V_{(N-2)} = 3 \cdot R_{node} \cdot I_{SA}.  \quad\text{Eq. 3:}$$

Likewise, the voltage between node 2 and node 1 may be represented by Eq. 4:

$$\Delta V_2 = (N-1) \cdot R_{node} \cdot I_{SA};  \quad\text{Eq. 4:}$$

and the voltage between node 1 and node 0 may be represented by Eq. 5:

$$\Delta V_1 = N \cdot R_{node} \cdot I_{SA}.  \quad\text{Eq. 5:}$$

The total resistance $R_{tot}$ and the total current $I_{tot}$ of the $V_{BLH}$ bus line 16 may be represented by Eqs. 6 and 7:

$$R_{tot} = N \cdot R_{node}; \text{ and} \quad\text{Eq. 6:}$$

$$I_{tot} = N \cdot I_{SA} \quad\text{Eq. 7:}$$

The total voltage drop from node 0 near transistor 22 to the end of the bus 16 at node N can be calculated as the sum of the voltage drop across each node. This calculation is shown in Eq. 8:

$$\Delta V_{tot_N} = \qquad\qquad\qquad\text{Eq. 8:}$$

$$\sum_{i=1}^{N} R_{node} \cdot i \cdot I_{SA} = R_{node} \cdot I_{SA} \cdot \sum_{i=1}^{N} i = R_{node} \cdot I_{SA} \cdot \frac{N(N+1)}{2};$$

$$\text{where:}\quad R_{node} = \frac{R_{tot}}{N};\text{ and}$$

$$I_{SA} = \frac{I_{tot}}{N}.$$

Therefore, $$\Delta V_{tot_N} = \frac{R_{tot}}{N} \cdot \frac{I_{tot}}{N} \cdot \frac{N(N+1)}{2} = \frac{1}{2} R_{tot} \cdot I_{tot} \cdot \frac{(N+1)}{N}. \qquad \text{Eq. 9:}$$

The voltage at node N relative to ground can be easily seen as the difference between the voltage level $V_{BLH}$ at node 0 and the voltage drop across the line 16 and shown as:

$$V_{BLH_N} = V_{BLH} - \Delta V_{tot_N}. \qquad \text{Eq. 10:}$$

There is a possibility that the total voltage drop $\Delta V_{tot_N}$ will decrease the voltage $V_{BLN_N}$ to a level that is insufficient to effect a write or refresh cycle, resulting in lost data. Eq. 9 shows that the voltage drop $\Delta V_{tot_N}$ can be lowered by lowering the resistance $R_{tot}$, e.g., by changing materials used for the bus or by making the bus wider (or thicker). These solutions, however, are often not sufficient. For example, using a wider bus line 16 for the voltage $V_{BLH}$ consumes additional chip space, an undesirable result.

Embodiments of the present invention provide technical advantages by distributing the feedback regulator output transistor along the array edge. Rather than using a single large transistor, several output transistors are used. In one embodiment, the transistor is divided into several different channel width sections to compensate for current drive losses due to voltage drops along the power bus, e.g., the source of the p-FET output transistors. In accordance with embodiments of the present invention, the external power supply voltage $V_{DD}$ is used for the power bus along the array edge, rather than the voltage $V_{BLH}$.

Figure 5:
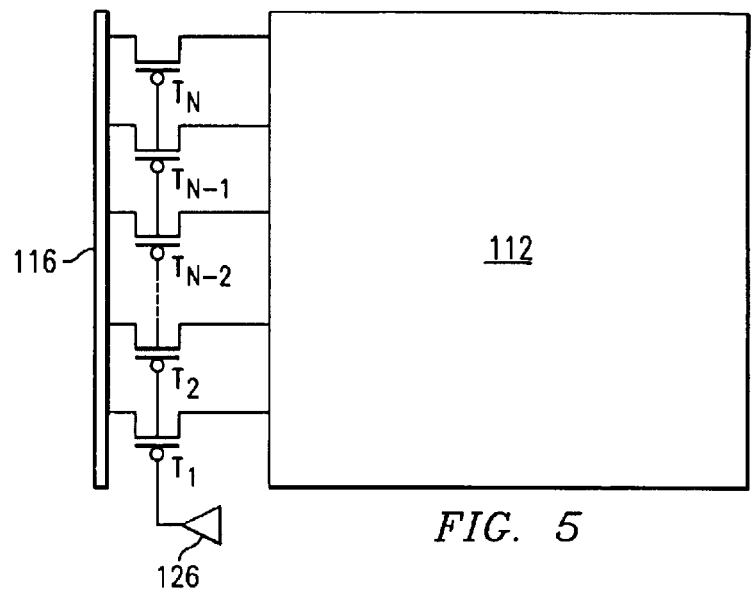
FIG. 5 shows the voltage regulator with a distributed output transistor coupled to an array in accordance with an embodiment of the invention.

FIG. 4a shows an embodiment of the present invention having a voltage or feedback regulator 124 with a plurality of output transistors $T_1$ to $T_N$ (generically $T_n$). FIG. 5 shows that the circuit of FIG. 4a would ordinarily be disposed along one edge of the memory array 112. In this embodiment, the bus 116 carries the external supply voltage $V_{DD}$ (or any other power source that can be used to generate the internal voltage $V_{BLH}$). Rather than generate the internal voltage $V_{BLH}$ once along the line, the internal voltage will be generated a number of times along the line. Each location that generates the internal voltage will have a different power source voltage $V_{DD}-\Delta V$, where $\Delta V$ is the voltage drop from the first end of the line that is coupled to the $V_{DD}$ source to the node at issue. Accordingly, the feedback transistor $T_n$ will be sized to compensate for this difference. This is shown in FIG. 4a by noting that each transistor $T_n$ has a width $W_n$.

Each transistor $T_n$ is designed to carry a drain current of $I_{SA}$ so that a constant output voltage $V_{BLH}$ is provided along the array edge. The drain current $I_{SA}$ is assumed to be the same for all of the transistors $T_n$. However, at the far end of the array, e.g., transistor $T_N$ furthest from the power supply $V_{DD}$ at node 0, the transistor gate to source voltage is smaller than at the near end (proximate transistor $T_1$) because of the power bus $V_{DD}$ IR-drop. This voltage difference will be compensated for.

The voltage regulator 124 includes a differential amplifier 126 having an output coupled to the gate of each of the output transistors $T_1$ to $T_N$. Reference voltage $V_{REF}$ is coupled to one input of the differential amplifier 126, and internal supply voltage $V_{BLH}$ is coupled to the other input of the differential amplifier. In one embodiment, the potential $V_{BLH}$ from node 1 is coupled to an input of the differential amplifier 126. Alternatively, the voltage level $V_{BLH}$ from another node, or from all nodes 1 to N, may be coupled to an input of the differential amplifier 126.

In accordance with an embodiment of the invention, to compensate for the resulting current loss, the channel widths of the far end transistors $T_N$, $T_{N-1}$ and $T_{N-2}$ are designed to be wider than the channel width of the near end transistors $T_1$ and $T_2$. A calculation of the transistor width $W_n$ for any transistor $T_n$ (n being an integer between 1 and N) to correct for power bus $V_{DD}$ IR-drop will next be described.

First, the power bus $V_{DD}$ voltage drop may be calculated as follows. The voltage drop $\Delta V_n$ between any two nodes (n−1) and n may be calculated using Eq. 11:

$$\Delta V_n = (N-n+1) \cdot I_{SA} \cdot R_{node} \qquad \text{Eq. 11:}$$

where N is the total number of nodes, $R_{node}$ is the resistance between any two nodes and $I_{SA}$ is the current flowing from any node. As noted above, the calculations here have been simplified by assuming that the resistance between any two nodes is the same and the same current flows from all nodes. This assumption need not be true in order to utilize the concepts of the invention. In other words, Eq. 11 can be modified to calculate the voltage drop between any two nodes as the current flowing through the nodes times the resistance between the two nodes.

The total voltage drop from node 0 to any node n can be calculated as the sum of the voltage drops at all nodes between node 0 and node n. Maintaining the original assumptions, this can be as shown in Eq. 12:

$$\Delta V_{tot_n} = \sum_{i=1}^{n} I_{SA} \cdot R_{node} \cdot (N-i+1) \qquad \text{Eq. 12:}$$

$$= I_{SA} \cdot R_{node} \cdot \left\{ n(N+1) - \frac{n(n+1)}{2} \right\}$$

$$= I_{SA} \cdot R_{node} \cdot n \cdot \left\{ N - \frac{1}{2}(n-1) \right\}.$$

The power bus voltage $V_{DD}$ at any node n may be calculated using Eq. 13:

$$V_{DD_n} = V_{DD} - \Delta V_{tot_n} = V_{DD} - I_{SA} \cdot R_{node} \cdot n \cdot \{N - \frac{1}{2}(n-1)\}. \qquad \text{Eq. 13:}$$

The transistor dimensioning may be calculated using the following equations. Using principles of semiconductor device physics, the saturation current $I_{DS}$ between the source and drain of a p-channel field effect transistor $T_n$ can be calculated as:

$$I_{DS_n} = \frac{1}{2} \mu C_{ox} \cdot \frac{W_n}{L_n} (V_{DD_n} - V_G - |V_{tp}|)^2; \qquad \text{Eq. 14:}$$

where $\mu$ is the mobility of holes in the transistor $T_n$, $C_{ox}$ is the capacitance of the gate oxide, $W_n$ is the transistor channel width, $L_n$ is the transistor channel length, $V_{DD_n}$ is the voltage at the source, $V_G$ is the voltage applied to the gate, and $V_{tp}$ is the threshold voltage of the p-channel device. The voltages $V_{DD_n}$ and $V_G$ are derived from the circuit (FIG. 4a) and each of the other variables is set by the transistor design. In typical embodiments, the transistor length $L_n$ is typically set to the minimum feature design L and the width $W_n$ is varied so that the current $I_{DS_n}$ is equal to $I_{SA}$ for all transistors $T_n$. The transistor parameters $\mu$, $C_{ox}$ and $V_{tp}$ are assumed to be constant for all transistors.

Combining Eqs. 13 and 14 and assuming the length of all transistors is L, the current equation for the transistor at node n can be restated as in Eq. 15:

$$I_{DS_n} = \frac{1}{2}\mu C_{ox} \cdot \frac{W_n}{L}\left(V_{DD} - I_{SA} \cdot R_{node} \cdot n\left\{N - \frac{1}{2}(n-1)\right\} - V_G - |V_{tp}|\right)^2; \quad \text{Eq. 15:}$$

Eq. 15 can be further simplified by defining some terms $$B = \frac{1}{2}\mu C_{ox} \cdot \frac{1}{L};$$

$$V_{\it{eff}} = V_{DD} - V_G - |V_{tp}|; \text{ and}$$

$$V_R = I_{SA} \cdot R_{node}.$$

As such, $I_{DS_n}$ can be set to $I_{SA}$ for all transistors $T_n$ and Eq. 15 can be rewritten as:

$$I_{SA} = B \cdot W_n(V_{\it{eff}} - V_R \cdot n\{N - \frac{1}{2}(n-1)\})^2; \quad \text{Eq. 16:}$$

Equation 16 can then be used to find the width $W_n$ for each output transistor as shown in Eq. 17:

$$W_n = \frac{I_{SA}}{B \cdot \left(V_{\it{eff}} - V_R \cdot n \cdot \left\{N - \frac{1}{2}(n-1)\right\}\right)^2}. \quad \text{Eq. 17:}$$

As such, the channel width of transistor $T_N$ may be about 50% larger than that of transistor $T_1$, as an example.

When each transistor $T_n$ operates in saturation node, the drain current is independent of the source to drain voltage, neglecting the channel length modulation for the first order calculation. To stay in saturation, the $V_{BLH}$ voltage should be smaller than $V_G$ plus the p-FET threshold voltage $|V_{tp}|$. This can be achieved by design for a wide range of $V_{DD}$ values. Therefore, a relatively large voltage drop on the $V_{DD}$ bus is allowed, and the power bus $V_{DD}$ width can be made much narrower, e.g., a bus width of about 20 $\mu$m compared to 130 $\mu$m bus width for a prior art $V_{BLH}$ power bus.

Figure 4B:
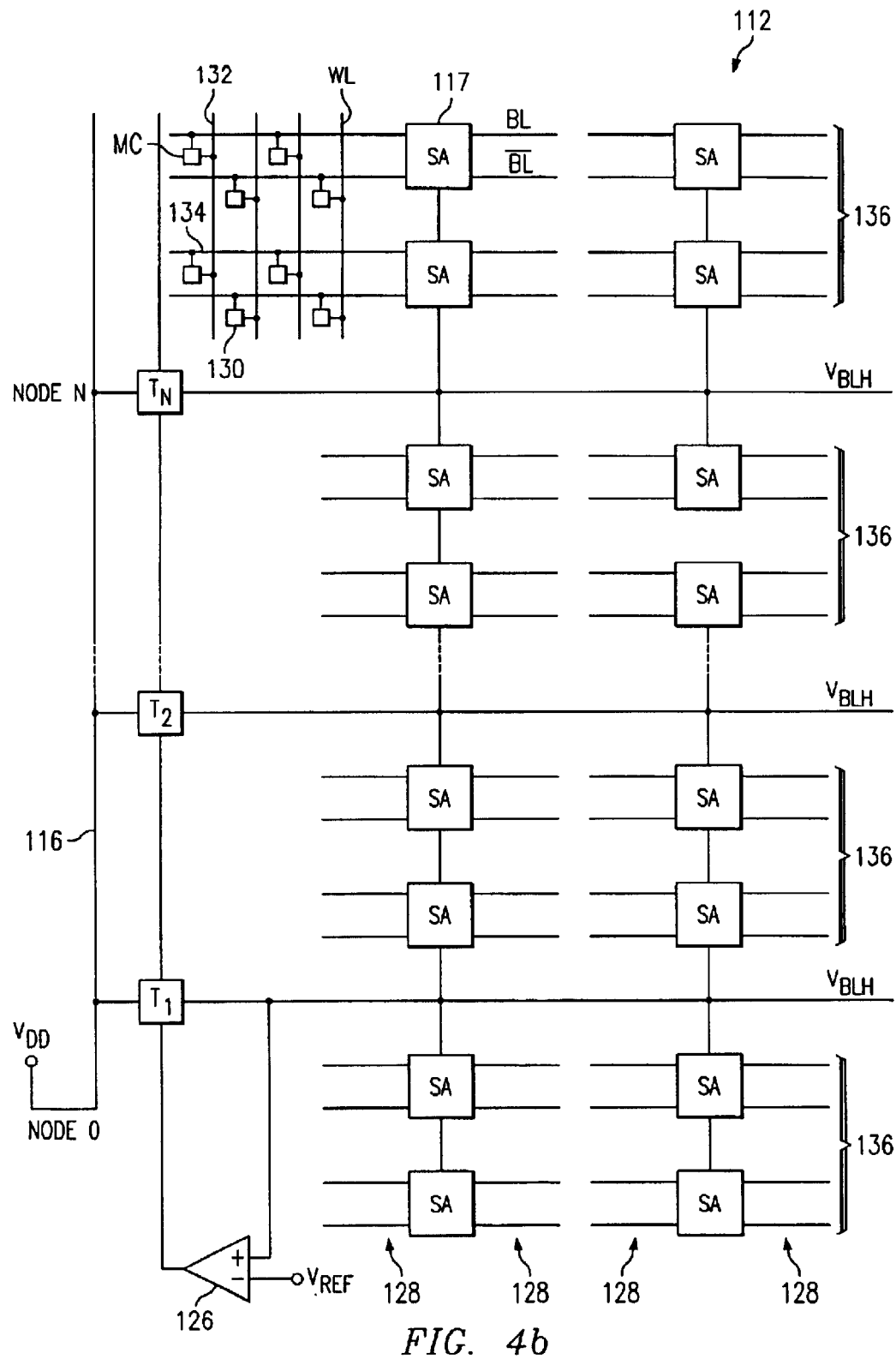
FIG. 4b is a second schematic diagram showing the power distribution system for a memory array.

FIG. 4b shows how the power distribution system described here could be incorporated into a memory array 112. In the preferred embodiment, the array 112 is divided into a number of blocks 128. Each block includes a number of memory cells 130. Each memory cell 130 is formed at the intersection of a wordline 132 and a bitline 134. For the sake of simplicity, wordlines 132 and memory cells 130 are shown for only a small portion of the array. The blocks 128 are separated by stripes of sense amplifiers 117 on the right or left sides. Each sense amplifier 117 is shared by neighboring blocks. Each block may then be divided into sections 136. The $V_{BLH}$ power busses run above the array. It is noted that individual sense amplifiers 117 are shown in FIG. 4b, as opposed to groups of sense amplifiers shown schematically as current sources in FIG. 4a.

A first power bus 116 is located adjacent an edge of array 112. Alternatively, the power bus 116 could run through the array. The drive transistors $T_n$ each include a current path between the power bus 116 and an associated one of the $V_{BLH}$ power busses. Each drive transistor $T_n$ also includes a control node (e.g., gate) coupled to the output of differential amplifier 126.

As one specific example, array 112 could be one quadrant or bank of a four quadrant DDR SDRAM. In this device, each 128 Mb bank may be physically separated into a number of blocks, e.g., 16 blocks, each with 8 Mb in a folded bitline (BL) configuration. A block may comprise 1024 local wordlines (LWLs). The blocks may be separated by stripes of 4 k shared sense amplifiers. Each block may then be divided into 16 sections by row gaps with each section containing 512 kb. A local data line (LDQ) spans two sections so that, in the column direction, the sections are paired, forming 8 column segments. Traditional mid-level sensing is accomplished using latch-type sense amplifiers with a bitline (BL) high level of 1.5V. BL-BL noise is approximately halved by BL twisting. There may be 512 memory cells (or bits) coupled to each bitline.

Figure 6:
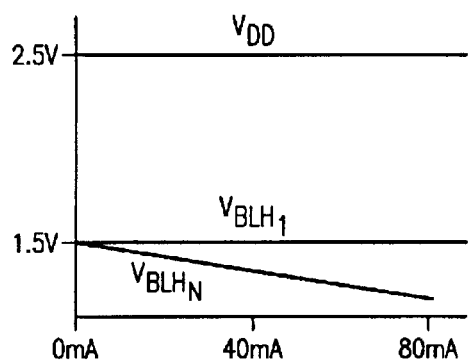
FIG. 6 is a graph showing the voltage levels $V_{BHL}$ and $V_{DD}$ as a function of load current for a prior art voltage regulation scheme.
Figure 7:
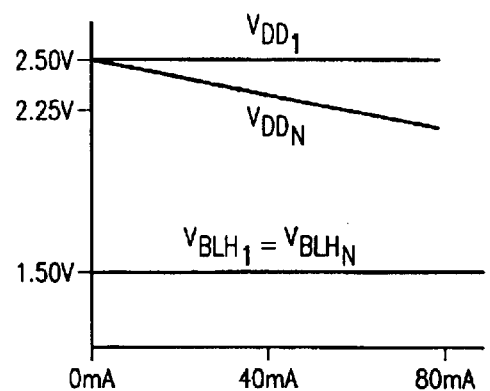
FIG. 7 is a graph showing the voltage $V_{BHL}$ and $V_{DD}$ as a function of load current for a preferred embodiment voltage regulation scheme of the present invention.

FIGS. 6 and 7 provide graphs that compare the supply voltages derived for the circuits of FIGS. 3 and 4a, respectively. Each graph shows the external supply voltage $V_{DD}$ and the internal supply voltage $V_{BLH}$ as a function of load current.

Referring first to FIG. 6, the $V_{DD}$ supply voltage remains constant, e.g., at 2.5 V in this example. The voltage $V_{BLH}$ at node 1 (FIG. 3) remains steady at 1.5 V over a range of currents, e.g., 0–80 mA. Due to the IR drop across the $V_{BLH}$ line 16, however, the voltage level $V_{BLHN}$ at node N decreases from 1.5 V as the current increases. This voltage drop can cause device failures and is typically avoided by minimizing the slope of the line, e.g., minimizing the line resistance.

FIG. 7 provides the same information for a circuit as constructed in FIG. 4a. In this case, the voltage drops along the $V_{DD}$ bus 116. Since the internal supply voltage $V_{BLH}$ is generated locally at each node, there is no significant voltage variation, in accordance with embodiments of the present invention. In other words, $V_{BLH1} = V_{BLHN}$ = a constant 1.5 V over all current ranges 0–80 mA. The decrease in the voltage $V_{DD}$ is not a problem because it is compensated for by the drive transistors $T_n$. The calculations of FIGS. 6 and 7 assume that the width of the power bus is the same for both examples.

It can be shown that $V_{BLH}$ is independent of load current. For a squ are law transistor current behavior, $V_{BLHn}$ is strictly constant only for one load current (operation point). Eq. 17 calculates the $W_n$ for this operation point (note that $V_{\it{eff}}$ and $V_R$ are also dependent on $I_{SA}$).

State of the art short channel devices have a linear transistor current dependence on the difference between the gate-source voltage and the threshold voltage $(V_{gs}-V_t)$, i.e., $I_{ds} = \text{const}^* W^*(V_{gs}-V_t)$, because of carrier velocity saturation. Using this transistor current law in Eq. 17 results in a $W_n$ independent of $I_{SA}$, and therefore in a $V_{BLHn}$ independent of load current. The simulation data shown in FIG. 7 (see also the Wuensche et al. VLSI paper incorporated above) confirms the calculations.

An analytic proof is now provided as App. 1.

---

App. 1:
Proof that Wn is independent of load current for short channel transistors (linear current law)

Voltage on VDD bus at node n: Eq. 13

$VDD_n = VDD - I_{SA} \cdot R_{node} \cdot n \cdot \{N - \frac{1}{2}(n-1)\} = VDD - I_{SA} \cdot X$
where
$X = n \cdot R_{node} \cdot \{N - \frac{1}{2}(n-1)\}$
and for n = 1:

-continued

App. 1:
Proof that Wn is independent of load current for short channel transistors
(linear current law)

$VDD_1 = VDD - I_{SA} \cdot R_{node} \cdot N$
Transistor with carrier velocity saturation:

$I_{DS_n} = C_{ox} \cdot v_{sat} \cdot W_n \cdot (V_{DD_n} - V_G - |V_{tp}|) = K \cdot W_n \cdot (V_{DD_n} - V_G - |V_{tp}|)$
where
$K = C_{ox} \cdot V_{sat}$, and $v_{sat}$ is carrier saturation velocity
and for n = 1:
$I_{SA} = K \cdot W_1 \cdot (VDD - I_{SA} \cdot R_{node} \cdot N - V_G - |V_{tp}|)$
therefore
$V_G = VDD - |V_{tp}| - I_{SA} \cdot R_{node} \cdot N - I_{SA}/(K \cdot W_1)$
$V_G$ is constant for all transistors (control voltage)
Calculation of Wn:

$I_{SA} = K \cdot W_n \cdot (VDD - I_{SA} \cdot X - V_G - |V_{tp}|)$
substituting for $V_G$ results in:
$I_{SA} = K \cdot W_n \cdot I_{SA} \cdot \{R_{node} \cdot N - X + 1/(K \cdot W_1)\}$
since $I_{SA}$ cancels out, it follows that:
$W_n = W_1/\{1 + K \cdot W_1 \cdot (R_{node} \cdot N - X)\}$
and therefore Wn is independent of $I_{SA}$ FIG. 7 and the above discussion show that the internal voltage $V_{BLHn}$ is constant for all nodes n. The result can be achieved if a driver transistor $T_n$ is included at each node n (where a node is any point from which current flows from the bus). In many circumstances, however, variations in the internal voltage $V_{BLH}$ can be tolerated. For these embodiments, a single drive transistor can be provided for a number of nodes. In this case, the internal voltage $V_{BLHn}$ will vary in a periodic ramp as a function of distance from node 0. As an example, a preferred embodiment memory array includes 8192 columns (i.e., 4096 shared sense amplifiers per pair of blocks) with 128 internal $V_{BLH}$ supply busses. In this chip, sixteen drive transistors $T_n$ (n=1 to 16) drive the $V_{BLH}$ supply voltage. While the design could have used 128 transistors $T_n$, the designers determined that sixteen were sufficient. In other cases, more or fewer than 16 could have been used.

Embodiments of the present invention provide several advantages over prior art voltage regulator designs for memory semiconductors. The novel approach for generating the bitline high voltage $V_{BLH}$ described herein results in the ability to save chip area by allowing narrower power bussing. Compared to conventional schemes where a feedback regulator with a single output transistor is used, the output transistor is distributed along the array edge. In addition, the output transistor is divided into sections with different channel widths to compensate for current drive losses due to voltage drops along the $V_{DD}$ power bus, caused by gate to source voltage degradation of p-FET output transistors. This solution eliminates the IR drop on the $V_{BLH}$ line, inherent in the conventional scheme, and provides a constant voltage along the array edge.

Embodiments of the present invention are particularly useful when used in a 512 Mb DDR SDRAM application in 110 nm technology based on an 8 $F^2$ trench capacitor cell with a double gate vertical pass transistor. The invention has been described herein with particular application of a DDR SDRAM; however, the novel concept of using distributed output transistors to eliminate variations in the bitline high signal due to voltage drop along the $V_{BHL}$ bus has useful applications in other semiconductor memory devices, such as other DRAM devices, static RAM (SRAM) devices, flash memories, resistive memory devices such as magnetic random access memories (MRAMs), electrically programmable read-only-memories (EPROMs), and other types of memory devices, as examples.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A semiconductor memory device, comprising:
   an array of memory cells;
   a plurality of sense amplifiers, the sense amplifiers arranged in groups, each group including more than one sense amplifier;
   a plurality of bitlines coupled to the memory cells, each bitline coupled to one of the sense amplifiers;
   a plurality of wordlines coupled to the memory cells, such that each memory cell is located at an intersection of a bitline and a wordline;
   a power bus extending adjacent an edge of the array of memory cells; and
   a plurality of drive transistors disposed at varying locations adjacent the power bus, each drive transistor coupled between the power bus and at least one of the groups of sense amplifiers.

2. The device of claim 1 and further comprising a differential amplifier with an output coupled to a control node of each of the drive transistors.

3. The device of claim 1 wherein each of the drive transistors has a channel of a different width compared to other drive transistors.

4. The device of claim 3, and further comprising a voltage node coupled to a first end of the power bus, wherein ones of the drive transistors that are physically closer to the voltage node have a smaller channel width than ones of the drive transistors that are physically farther from the voltage node.

5. The device of claim 1 wherein each of the drive transistors comprises a p-channel field effect transistor.

6. The device of claim 1 wherein the semiconductor memory device is a dynamic random access memory (DRAM) device.

7. The device of claim 6 wherein the array of memory cells comprises one quadrant of a four quadrant DRAM device, the array including at least 134,217,728 memory cells.

8. The device of claim 7 wherein the semiconductor memory device is a double data rate (DDR) synchronous DRAM device.

9. A dynamic random access memory device comprising:
   an array of memory cells, each memory cell formed at the intersection of a bitline and a wordline;
   a plurality of sense amplifiers, each sense amplifier coupled to at least one pair of the bitlines;

the array of memory cells being divided into a plurality of sections, each of the sections including a group of the sense amplifiers and memory cells associated with the group of sense amplifiers;

a power bus extending adjacent the array;

a plurality of internal power busses, each of the internal power busses extending adjacent one of the sections;

a plurality of drive transistors, each drive transistor having a current path coupled between the power bus and an associated one of the internal power busses, each drive transistor also including a control node; and a differential amplifier with an output coupled to the control node of each of the drive transistors, the differential amplifier including a first input coupled to at least one of the internal power busses and a second input coupled to a reference voltage node.

10. The device of claim 9 wherein each of the drive transistors comprises a field effect transistor with a channel having a length and a width, wherein the width of each drive transistor is different than the width of all of the other drive transistors.

11. The device of claim 9 wherein the power bus extends adjacent an edge of the array.

12. The device of claim 9 wherein the power bus is coupled to a VDD voltage source.

13. The device of claim 12 wherein each of the drive transistors comprises a field effect transistor with a channel having a length and a width and wherein the width of each drive transistor is greater than the width of all drive transistors that are physically closer to the VDD voltage source.

14. The device of claim 12 and further comprising an external voltage source pin carrying an external voltage level, wherein the VDD voltage source carries a voltage that is substantially the same as the external voltage level.

15. The device of claim 9:
wherein the array of memory cells comprises one quadrant of a four-quadrant memory chip;
wherein the army includes at least 128 Mb of memory cells divided into at least 16 blocks wherein each of the sections includes memory cells from each of the blocks; and
wherein adjacent ones of the blocks are separated by a stripe of sense amplifiers, each sense amplifier being shared by bitlines from two of the blocks.

16. A power delivery system for an integrated circuit, the system comprising:
a first power bus;
a second power bus;
a third power bus;
a first drive transistor with a current path coupled between the first power bus and the second power bus, the first drive transistor having a first current path width, and the first drive transistor having a first control node;
a second drive transistor with a current path coupled between the first power bus and the third power bus, the second drive transistor having a second current path width being different than the first current path width, the second drive transistor having a second control node; and
a differential amplifier having a first input, a second input and an output, the first input being coupled to at least one of the second power bus or the third power bus, the second input being coupled to a reference voltage node and the output being coupled to the first control node and to the second control node.

17. The system of claim 16 wherein the first power bus is coupled to a voltage source at a first end, wherein the first drive transistor is physically closer to the first end than the second drive transistor, and wherein the first current path width is smaller than the second current path width.

18. The system of claim 16 and farther comprising:
a fourth power bus; and
a third drive transistor with a current path coupled between the first power bus and the fourth power bus, the third drive transistor having a third current path width that is different than both the first current path width and the second current path width, the third drive transistor having a third control node that is coupled to the output of the differential amplifier.

19. The system of claim 16 wherein the differential amplifier causes the second and the third power busses to carry substantially the same voltage.

20. The system of claim 19 wherein the first power bus carries a voltage of about 2.5 volts and wherein the second and third power busses carry a voltage of about 1.5 volts.

21. A method of generating an internal voltage, the method comprising:
providing a voltage source node;
coupling the voltage source node to a power bus;
coupling a plurality of drive transistors along various physical locations along the power bus, each drive transistor including a current path input and a current path output and a control node, wherein ones of the drive transistors that are physically closer to the voltage source node have a smaller current path for a given signal at the control node than ones of the drive transistors that are physically farther from the voltage source node;
comparing the voltage level at an output node of at least one of the plurality of drive transistors with a reference voltage; and
varying a voltage applied to the control node of each of the drive transistors based on a result of the comparing.

22. The method of claim 21 wherein the method of generating the internal voltage comprises generating a voltage to be applied to an array of memory cells.

23. A semiconductor memory device, comprising:
an array of memory cells;
a plurality of sense amplifiers;
a plurality of bitlines coupled to the memory cells, each bitline coupled to one of the sense amplifiers;
a plurality of wordlines coupled to the memory cells, such that each memory cell is located at an intersection of a bitline and a wordline;
a power bus extending adjacent an edge of the array of memory cells;
a plurality of drive transistors disposed at varying locations adjacent the power bus, each drive transistor coupled between the power bus and at least one of the sense amplifiers; and
a differential amplifier with an output coupled to a control node of each of the drive transistors.

24. The device of claim 23 wherein each of the drive transistors has a channel of a different width compared to other drive transistors.

25. The device of claim 23, and further comprising a voltage node coupled to a first end of the power bus, wherein ones of the drive transistors that are physically closer to the voltage node have a smaller channel width than ones of the drive transistors that are physically farther from the voltage node.

26. The device of claim 23 wherein each of the drive transistors comprises a p-channel field effect transistor.

27. The device of claim 23 wherein the semiconductor memory device is a dynamic random access memory (DRAM) device.

28. The device of claim 27 wherein the array of memory cells comprises one quadrant of a four quadrant DRAM device, the array including at least 134,217,728 memory cells.

29. The device of claim 28 wherein the semiconductor memory device is a double data rate (DDR) synchronous DRAM device.

30. A semiconductor memory device, comprising:
    an array of memory cells;
    a plurality of sense amplifiers;
    a plurality of bitlines coupled to the memory cells, each bitline coupled to one of the sense amplifiers;
    a plurality of wordlines coupled to the memory cells, such that each memory cell is located at an intersection of a bitline and a wordline;
    a power bus extending adjacent an edge of the array of memory cells;
    a plurality of drive transistors disposed at varying locations adjacent the power bus, each drive transistor coupled between the power bus and at least one of the sense amplifiers, wherein each of the drive transistors has a channel of a different width compared to other drive transistors.

31. The device of claim 30, and further comprising a voltage node coupled to a first end of the power bus, wherein ones of the drive transistors that are physically closer to the voltage node have a smaller channel width than ones of the drive transistors that are physically farther from the voltage node.

32. The device of claim 30 wherein each of the drive transistors comprises a p-channel field effect transistor.

33. The device of claim 30 wherein the semiconductor memory device is a dynamic random access memory (DRAM) device.

34. The device or claim 33 wherein the array of memory cells comprises one quadrant of a four quadrant DRAM device, the array including at least 134,217,728 memory cells.

35. The device of claim 34 wherein the semiconductor memory device is a double data rate (DDR) synchronous DRAM device.

* * * * *